United States Patent
Kobayashi et al.

(10) Patent No.: US 10,062,750 B2
(45) Date of Patent: Aug. 28, 2018

(54) SEMICONDUCTOR DEVICE AND METHOD OF MANUFACTURING SEMICONDUCTOR DEVICE

(71) Applicants: FUJI ELECTRIC CO., LTD., Kawasaki-shi, Kanagawa (JP); SUMITOMO ELECTRIC INDUSTRIES, LTD., Osaka-shi, Osaka (JP)

(72) Inventors: Yusuke Kobayashi, Tsukuba (JP); Hiromu Shiomi, Tsukuba (JP); Shinya Kyogoku, Tsukuba (JP); Shinsuke Harada, Tsukuba (JP); Akimasa Kinoshita, Matsumoto (JP)

(73) Assignees: FUJI ELECTRIC CO., LTD., Kawasaki-Shi, Kanagawa (JP); SUMITOMO ELECTRIC INDUSTRIES, LTD., Osaka-Shi, Osaka (JP)

( * ) Notice: Subject to any disclaimer, the term of this patent is extended or adjusted under 35 U.S.C. 154(b) by 0 days.

(21) Appl. No.: 15/669,168

(22) Filed: Aug. 4, 2017

(65) Prior Publication Data
US 2018/0040690 A1    Feb. 8, 2018

(30) Foreign Application Priority Data
Aug. 5, 2016 (JP) ................................. 2016-155089

(51) Int. Cl.
H01L 21/8234    (2006.01)
H01L 29/06    (2006.01)
(Continued)

(52) U.S. Cl.
CPC ...... *H01L 29/0634* (2013.01); *H01L 21/0455* (2013.01); *H01L 29/1095* (2013.01);
(Continued)

(58) Field of Classification Search
CPC ....... H01L 21/823487; H01L 29/66287; H01L 29/66734
(Continued)

(56) References Cited

U.S. PATENT DOCUMENTS 9,093,522 B1 * 7/2015 Zeng .................. H01L 29/7813
2009/0166730 A1 * 7/2009 Okuno ................ H01L 29/0623
257/330
(Continued)

OTHER PUBLICATIONS

Tsunenobu Kimoto and James A. Cooper, "Fundamentals of Silicon Carbide Technology", IEEE Press, pp. 320-324, 2014.

*Primary Examiner* — George Fourson, III
(74) *Attorney, Agent, or Firm* — Rabin & Berdo, P.C.

(57) ABSTRACT

An active region through which current flows in a semiconductor device includes an $n^-$-type silicon carbide epitaxial layer formed on a front surface of an $n^+$-type silicon carbide semiconductor substrate; a p-type layer becoming a channel region; a trench formed so as to be in contact with a p-type layer and having an oxide film and a gate electrode embedded therein; a $p^+$-type layer arranged beneath the trench and between trenches; an $n^-$-type layer in contact with the p-type layer, a $p^+$-type layer, and the trench, and arranged in contact with a $p^+$-type layer or on a surface side of the semiconductor substrate; an n-type layer in contact with the $n^-$-type silicon carbide epitaxial layer and the $p^+$-type layer, and having an impurity concentration higher than that of the $n^-$-type layer and that of the $n^-$-type silicon carbide epitaxial layer.

4 Claims, 5 Drawing Sheets

(51) Int. Cl.
  *H01L 29/16* (2006.01)
  *H01L 29/10* (2006.01)
  *H01L 29/78* (2006.01)
  *H01L 21/04* (2006.01)
  *H01L 29/66* (2006.01)

(52) U.S. Cl.
  CPC .... *H01L 29/1608* (2013.01); *H01L 29/66068* (2013.01); *H01L 29/7811* (2013.01); *H01L 29/7813* (2013.01); H01L 21/823487 (2013.01); H01L 29/66287 (2013.01); H01L 29/66734 (2013.01)

(58) Field of Classification Search
  USPC .......................................... 438/270; 257/263
  See application file for complete search history.

(56) References Cited

U.S. PATENT DOCUMENTS

| | | | |
|---|---|---|---|
| 2014/0145209 A1* | 5/2014 | Kumagai | H01L 29/41766 257/77 |
| 2016/0260829 A1* | 9/2016 | Aichinger | H01L 27/0629 |
| 2018/0040698 A1* | 2/2018 | Kobayashi | H01L 29/1041 |
| 2018/0076316 A1* | 3/2018 | Kinoshita | H01L 29/7813 |

* cited by examiner

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2016-155089, filed on Aug. 5, 2016, the entire contents of which are incorporated herein by reference.

BACKGROUND OF THE INVENTION

1. Field of the Invention

Embodiments of the invention relate to a semiconductor device and method of manufacturing a semiconductor device.

2. Description of the Related Art

Conventionally, silicon (Si) is used as a constituent material of a power semiconductor device that controls high voltage and/or large current. There are several types of power semiconductor devices such as bipolar transistors, insulated-gate bipolar transistors (IGBTs), and MOSFETs. These devices are selectively used according to an intended purpose.

For example, bipolar transistors and IGBTs have high current density compared to MOSFETs, and can be adapted for large current but cannot be switched at high speed. In particular, the limit of switching frequency is about several kHz for bipolar transistors and about several tens of kHz for IGBTs. On the other hand, power MOSFETs have low current density compared to bipolar transistors and IGBTs, and are difficult to be adapted for large current but can be switched at high speed up to about several MHz.

However, there has been a strong demand in the market for a power semiconductor device achieving both large current and high speed. Thus, IGBTs and power MOSFETs have been intensively developed and improved, and the performance of power devices has substantially reached the theoretical limit determined by the material. In terms of power semiconductor devices, semiconductor materials replacing silicon have been investigated and silicon carbide (SiC) has been focused on as a semiconductor material enabling production (manufacture) of a next-generation power semiconductor device with a low on voltage, high-speed characteristics, and high-temperature characteristics.

Silicon carbide is chemically a very stable semiconductor material, has a wide bandgap of 3 eV, and can be used very stably as a semiconductor even at high temperatures. Silicon carbide has a critical electric field strength that is ten times that of silicon or greater, and thus is expected to be a semiconductor material that can sufficiently reduce on-resistance. These merits are common to other semiconductors (hereinafter, wide bandgap semiconductor) having a bandgap greater than that of silicon, such as gallium nitride (GaN). Thus, lower resistance and higher voltages of a semiconductor device can be achieved by using a wide bandgap semiconductor. While embodiments are discussed below including silicon carbide as a wide-bandgap semiconductor layer, embodiments of the invention are not limited to silicon carbide or gallium nitride, but encompass any wide-bandgap semiconductor material, including silicon carbide, gallium nitride, aluminum nitride, boron nitride, and diamond.

The efficiency of a power semiconductor device using a wide bandgap semiconductor may be improved by reducing the ON resistance. When a trench-type MOSFET is used for a conventional planar MOSFET, a shorter cell pitch and higher mobility may be obtained, enabling reduction of the ON resistance (for example, refer to Tsunenobu Kimoto and James A. Cooper, "Fundamentals of Silicon Carbide Technology", pp. 320-324, IEEE Press, 2014).

FIG. 10 is a cross-sectional view of an active region of a conventional trench-type MOSFET. An $n^-$-type silicon carbide epitaxial layer (wide bandgap semiconductor deposition layer) 101 is stacked on a first main surface, e.g., a (0001) face (Si face), of an $n^+$-type silicon carbide substrate (wide bandgap semiconductor substrate) 102. On the first main surface of the $n^-$-type silicon carbide epitaxial layer 101, plural $p^+$-type base regions 103 are formed.

On the first main surface (front surface) side of the $n^-$-type silicon carbide epitaxial layer, a p-type channel region 116 and an $n^+$-type source region 117 are formed. Further, plural trenches 119 are formed and a gate electrode 120 of poly-silicon is embedded. Further, on the first main surface (front surface) of the $n^-$-type silicon carbide epitaxial layer 101, a field insulating film 121 and a source electrode 122 are formed.

To further reduce the ON resistance of the depicted trench-type MOSFET, reduction of the channel length is advantageous.

SUMMARY OF THE INVENTION

According to one aspect of the present invention, a semiconductor device has an active region through which current flows. The active region includes: a first first-conductivity-type semiconductor layer formed on a front surface of a semiconductor substrate of a first conductivity type, the first first-conductivity-type semiconductor layer having a concentration lower than that of the semiconductor substrate; a channel region of a second conductivity type, forming a channel region; a trench formed so as to be in contact with the channel region, the trench having an oxide film and a gate electrode embedded therein; a first second-conductivity-type semiconductor layer arranged beneath the trench and between trenches; a second first-conductivity-type semiconductor layer in contact with the channel region, a second second-conductivity-type semiconductor layer, and the trench, the second first-conductivity-type semiconductor layer being arranged in contact with the first second-conductivity-type semiconductor layer or on a surface side of the semiconductor substrate; and a third first-conductivity-type semiconductor layer in contact with the second first-conductivity-type semiconductor layer, the first first-conductivity-type semiconductor layer, and the first second-conductivity-type semiconductor layer, the third first-conductivity-type semiconductor layer having an impurity concentration higher than that of second first-conductivity-type semiconductor layer and that of first first-conductivity-type semiconductor layer.

In the semiconductor device, the second first-conductivity-type semiconductor layer has an impurity concentration that is 1.0 to 0.5 times that of the third first-conductivity-type semiconductor layer.

According to another aspect of the invention, a method of manufacturing a semiconductor device having an active region through which current flows, includes: forming a first first-conductivity-type semiconductor layer in the active region on a front surface of a semiconductor substrate of a first conductivity type, the first first-conductivity-type semiconductor layer having a concentration lower than that of the semiconductor substrate; forming a third first-conductivity-type semiconductor layer on a front surface of the first first-conductivity-type semiconductor layer, the third first-conductivity-type semiconductor layer having an impurity concentration higher than that of the first first-conductivity-type semiconductor layer; forming plural first second-conductivity-type semiconductor layers in the third first-conductivity-type semiconductor layer; forming a second first-conductivity-type semiconductor layer on a front surface of the third first-conductivity-type semiconductor layer, the second first-conductivity-type semiconductor layer having an impurity concentration lower than that of the third first-conductivity-type semiconductor layer; forming a second second-conductivity-type semiconductor layer in the second first-conductivity-type semiconductor layer so as to contact a first second-conductivity-type semiconductor layer of the plural first second-conductivity-type semiconductor layers; forming a channel region of a second conductivity type on a front surface of the second first-conductivity-type semiconductor layer; and forming a trench so as to be in contact with the channel region and have a depth reaching a different second-conductivity-type second semiconductor layer of the plural first second-conductivity-type semiconductor layers, the trench having an oxide film and gate electrode embedded therein.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
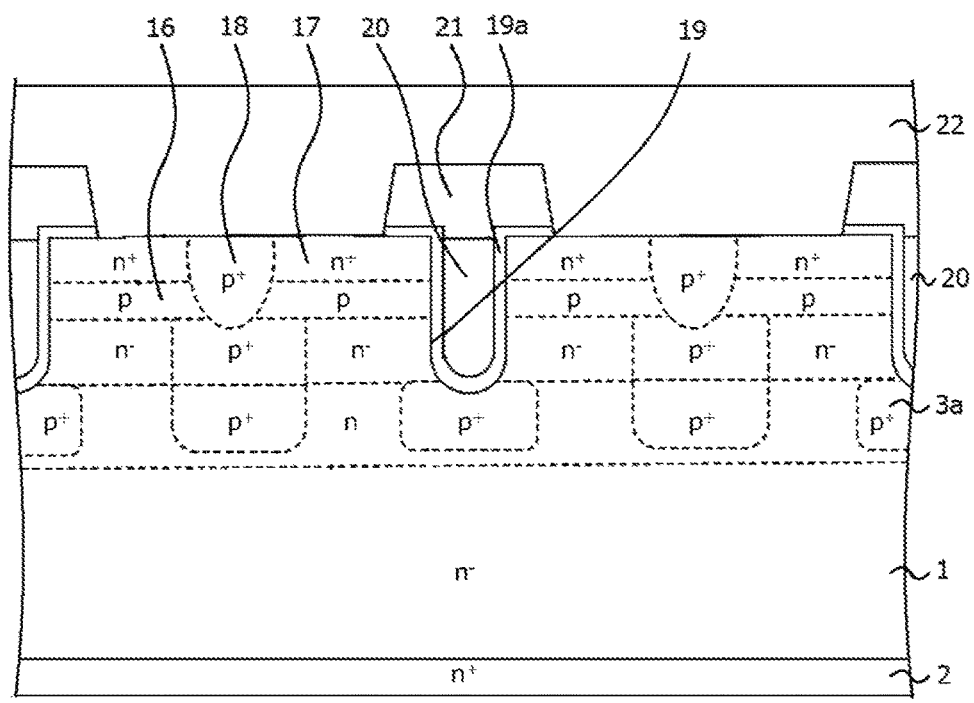
FIG. 1 is a cross-sectional view of an active region of a trench-type MOSFET according to an embodiment of the present invention.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. When the notations of n and/or p including + or − are the same, this indicates that the concentrations are close, but does not necessarily mean that the concentrations are equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

The semiconductor device according to the present invention uses a wide bandgap semiconductor. In an embodiment, a MOSFET will be described as an example of a silicon carbide semiconductor device produced using, for example, silicon carbide (SiC) as a wide bandgap semiconductor. Hereinafter, a structure of the active region according to the embodiment will be described taking an example in which a first conductivity type is assumed as an n-type and a second conductivity type is assumed as a p-type.

FIG. 1 is a cross-sectional view of the active region of a trench-type MOSFET according to the embodiment of the present invention. In the embodiment, mainly, by reducing the impurity concentration of an n-type CSL layer (n-type layer) 15 (15a, 15b) (FIG. 7) in contact with a p-type base region 3 (3a, 3b) (FIG. 7), a threshold value decrease originating from a short channel effect called drain induced-barrier lowering (DIBL) is suppressed, in an ON state.

As shown in FIG. 1, an n$^-$-type silicon carbide epitaxial layer (wide bandgap semiconductor deposition layer) 1 (also referred to as a first first-conductivity-type semiconductor layer) is stacked on a first main surface, e.g., a (0001) face (Si face), of an n$^+$-type silicon carbide substrate (wide bandgap semiconductor substrate) 2. On the first main surface of the n$^-$-type silicon carbide epitaxial layer 1, plural p$^+$-type base regions 3a and 3b are formed.

On the first main surface (front surface) side of the n$^-$-type silicon carbide epitaxial layer, a p-type channel region 16 and an n$^+$-type source region 17 are formed. Further, plural trenches 19 are formed and a gate electrode 20 of poly-silicon is embedded in each trench 19. Further, on the first main surface (front surface) of the n$^-$-type silicon carbide epitaxial layer 1, a field insulating film 21 and a source electrode 22 are formed.

When the impurity concentration of the n-type layer 15 is lowered, a depletion layer from a p-type layer spreads easily, blocking the current path whereby the ON resistance of the trench-type MOSFET suddenly increases. To prevent this, the n-type layer (CSL layer) 15 (15a, 15b)(FIG. 7) is provided having a two-layer structure in a height direction contacting a second semiconductor region (p$^+$-type regions 3a, 3b) of the second conductivity type. The n-type layer (CSL layer) 15 has a lowered impurity concentration in an n$^-$-type layer (also referred to as a second CSL layer, or as a second first-conductivity-type semiconductor layer) 15b in proximity to a channel p-type layer 16 having greater effect on DIBL suppression than the impurity concentration of an n-type layer (also referred to as a first CSL layer, or as a third first-conductivity-type semiconductor layer) 15a.

The n-type layer (second CSL layer) 15b is in contact with the channel region 16, the p$^+$-type region 3b, and the trench 19. Further, the n-type layer (second CSL layer) 15b is arranged to be in contact with the p$^+$-type region 3a or on a surface (front surface) side of the n$^-$-type silicon carbide semiconductor substrate 2. The n-type layer (first CSL layer) 15a is in contact with the second CSL layer 15b, the n$^-$-type silicon carbide epitaxial layer 1, and the p$^+$-type region 3a, and has an impurity concentration that is higher than that of the second CSL layer 15b and that of the n$^-$-type silicon carbide epitaxial layer 1. Other reference characters indicated in FIG. 1 will be described in detail hereinafter (refer to FIG. 7).

Figure 2:
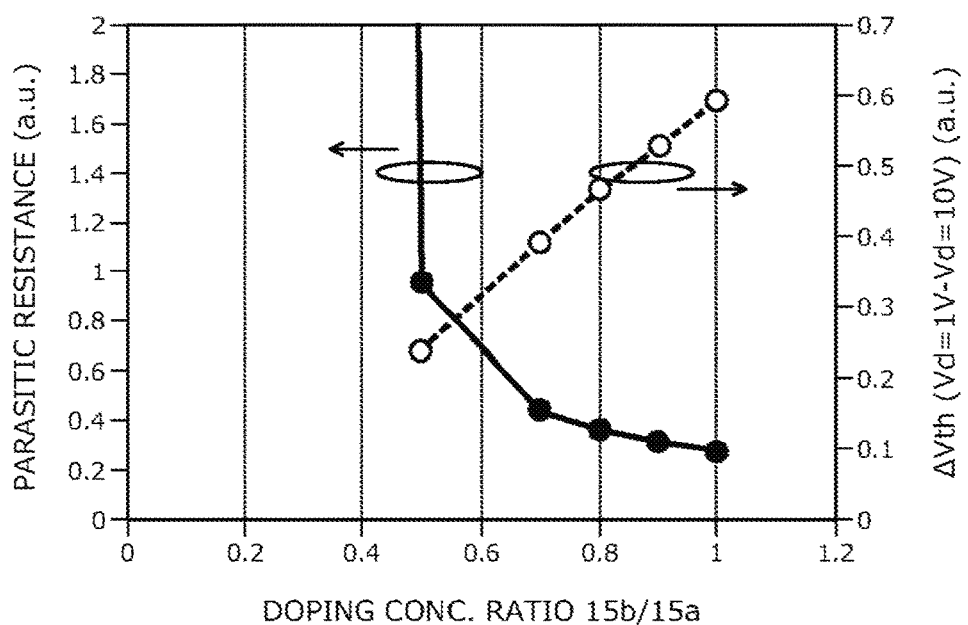
FIG. 2 is a graph depicting the relationship of an impurity concentration ratio of a two-layer n-type CSL and DIBL, and parasitic resistance.

FIG. 2 is a graph depicting the relationship of the impurity concentration ratio of the two-layer n-type CSL and DIBL, and parasitic resistance. The X axis represents the impurity concentration ratio of n−-type layer 15b and the n-type layer 15a. The Y axis represents prescribed resistance and ΔVth. ΔVth is an index representing the magnitude of DIBL and preferably, may be a small value.

As indicated in FIG. 2, the greater the impurity concentration ratio is reduced below 1.0, the more DIBL may be reduced. However, when the impurity concentration ratio is less than 0.5, the parasitic resistance suddenly increases. This is consequent to the increase in the parasitic resistance of a region of the n−-type layer 15b sandwiched by the p+-type region 3 (3a, 3b). As a result, it is found that when the impurity concentration ratio of the n−-type layer 15b and the n-type layer 15a is made to be 1.0 to 0.5, the short channel effect is suppressed and the increase of the parasitic resistance may be suppressed.

FIGS. 3, 4, 5, 6, and 7 are cross-sectional views of the state of the active region of the silicon carbide semiconductor device according to the embodiment during manufacture.

Figure 3:
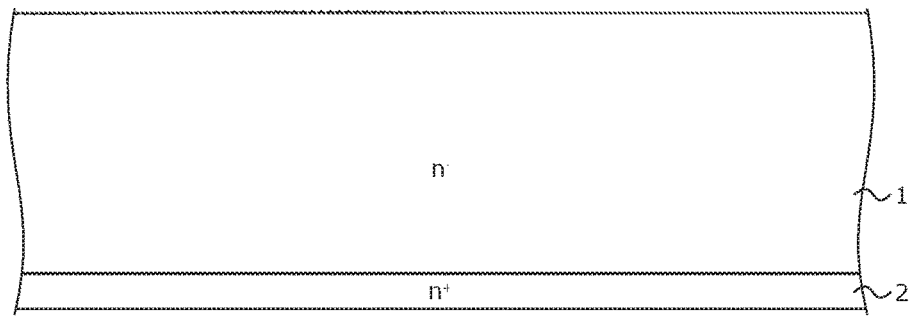
FIGS. 3, 4, 5, 6, and 7 are cross-sectional views of the state of the active region of the silicon carbide semiconductor device according to the embodiment during manufacture.

First, as depicted in FIG. 3, on the first main surface, e.g., (0001) face (Si face), of the n+-type silicon carbide substrate (also referred to as a high-concentration semiconductor substrate of the first conductivity type) 2 of a wide bandgap material, the n−-type silicon carbide epitaxial layer (first first-conductivity-type semiconductor layer of a low concentration) 1 is deposited.

The n+-type silicon carbide substrate 2, for example, is a silicon carbide single-crystal substrate doped with nitrogen (N). The n−-type silicon carbide epitaxial layer 1 is a low-concentration n-type drift layer doped with, for example, nitrogen to have an impurity concentration that is lower than that of the n+-type silicon carbide substrate 2. Hereinafter, the n+-type silicon carbide substrate 2 alone or the n+-type silicon carbide substrate 2 in combination with the n−-type silicon carbide epitaxial layer 1 is regarded as a silicon carbide semiconductor substrate.

Figure 4:
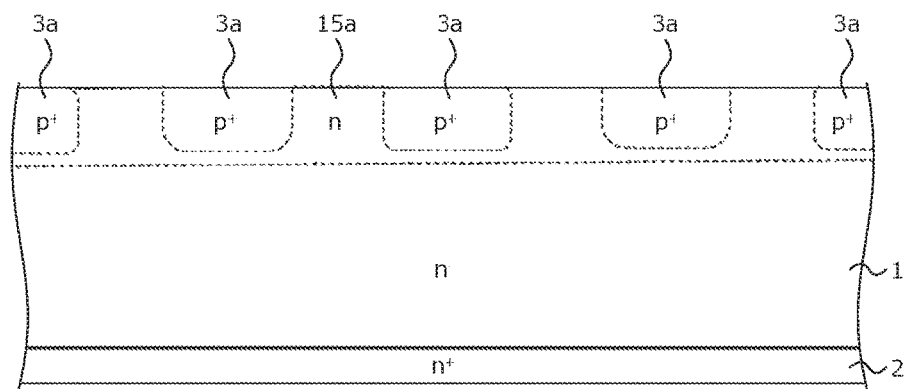

Next, as depicted in FIG. 4, on the first main surface side of the n−-type silicon carbide epitaxial layer 1, the dense n-type region (first CSL layer) 15a is formed by patterning by photolithography and ion implantation of nitrogen. The dense n-type region 15 has an impurity concentration that is lower than that of the n+-type silicon carbide substrate 2 and higher than that of the n−-type silicon carbide epitaxial layer 1; and, for example, is formed by doping nitrogen. The activated impurity concentration of the n-type layer 15a may be preferably about $1.0 \times 10^{16}$ to $1.0 \times 10^{19} cm^{-3}$ and the depth thereof may be preferably about 0.1 to 2.0 μm.

Next, the n-type layer 15a is patterned and ion implanted with aluminum, forming plural p-type base regions (p+-type regions) 3a along a length direction. 3a is a first p-type base region. The activated impurity concentration of the p+-type region 3a may be preferably about $1.0 \times 10^{17}$ to $1.0 \times 10^{19} cm^{-3}$, and the depth thereof may be preferably about 0.1 to 1.5 μm.

Further, on a surface of the n+-type silicon carbide substrate 2 on the side (rear surface of a silicon carbide semiconductor base) opposite the n-type silicon carbide epitaxial layer 1 side, a rear electrode is provided, forming a drain electrode.

Figure 5:
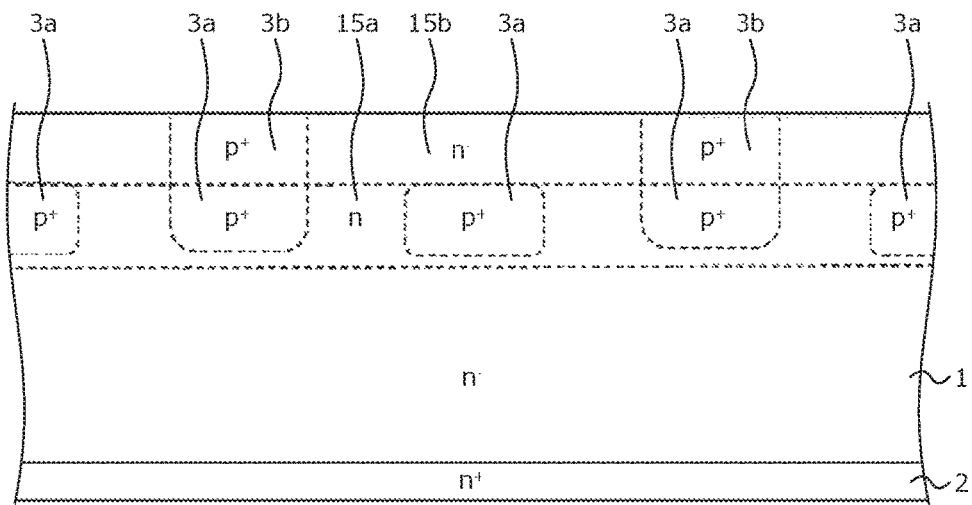

Next, as depicted in FIG. 5, on the front surface of the n-type layer 15a, silicon carbide of a concentration equal to that of the n−-type layer 1 is deposited by nitrogen-added epitaxial growth to have a thickness of about 0.1 to 1.5 μm and the n−-type layer 15b is formed by patterning by photolithography and ion implantation of nitrogen. The n−-type layer 15b is formed to have a concentration ratio of 1.0 to 0.5 with respect to the n-type layer 15a. The depth of the n−-type layer 15b may be preferably about 0.1 to 2.0 μm.

Next, on the front side of the p+-type region 3a, the p-type base layer (p+-type region 3b) is formed by patterning and ion implantation of aluminum so as to be electrically connected to the p+-type region 3a. 3b is a second p-type base region. The activated impurity concentration of the p+-type region 3b may be preferably about $1.0 \times 10^{17}$ to $1.0 \times 10^{19} cm^{A3}$ and the depth thereof may be preferably about 0.2 to 2.0 μm. Further, the n−-type layer 15b may be formed by epitaxial growth without using ion implantation, so as to have a concentration ratio of 1.0 to 0.5 with respect to the n-type layer 15a.

Figure 6:
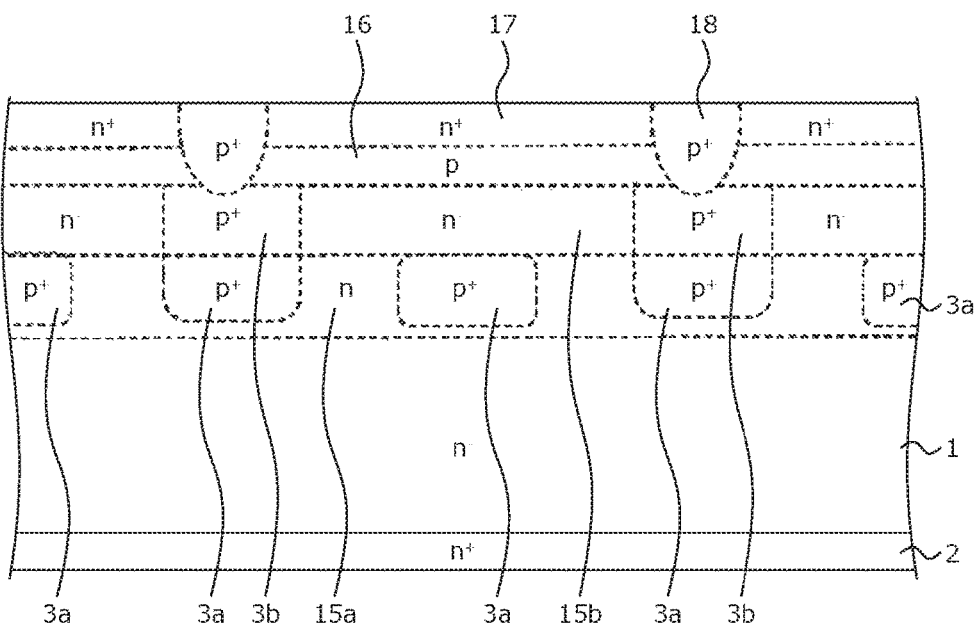

Next, as depicted in FIG. 6, silicon carbide is deposited on the front surface of the n−-type layer 15b to have a thickness of about 0.1 to 1.5 μm by nitrogen-added or aluminum-added epitaxial growth whereby the p-type channel region (p-type layer, channel region of the second conductivity type) 16 is formed. The activated impurity concentration of the p-type layer 16 may be preferably about $1.0 \times 10^{16}$ to $1.0 \times 10^{19} cm^{-3}$ and the depth thereof may be preferably about 0.3 to 1.5 μm. The p-type layer 16 may be formed to have a concentration of about $1.0 \times 10^{16}$ to $1.0 \times 10^{19} cm^{-3}$ by aluminum-added epitaxial growth and ion implantation of aluminum may be omitted.

Next, the front surface of the p-type layer 16 is patterned by photolithography and ion implanted with phosphorus or arsenic, or is ion implanted with nitrogen whereby the n-type source region (n+-type layer) 17 is formed. The activated impurity concentration of the n+-type layer 17 may be preferably about $1.0 \times 10^{19}$ to $1.0 \times 10^{20} cm^{-3}$ and the depth thereof may be preferably about 0.05 to 0.5 μm.

Next, the front surface of the n+-type layer 17 is patterned by photolithography and ion implanted with aluminum whereby the p+-type layer 18 is formed so as to be electrically connected to the p+-type region 3b. The activated impurity concentration of the p+-type layer 18 may be preferably about $1.0 \times 10^{17}$ to $1.0 \times 10^{20} cm^{-3}$ and the depth thereof may be preferably about 0.2 to 2.0 μm. After a carbon film (not shown) is deposited to have a thickness of about 0.01 to 5.0 μm, annealing at a temperature from 1500 to 1900 degrees C. is performed, activating the ion implanted impurities.

Figure 7:
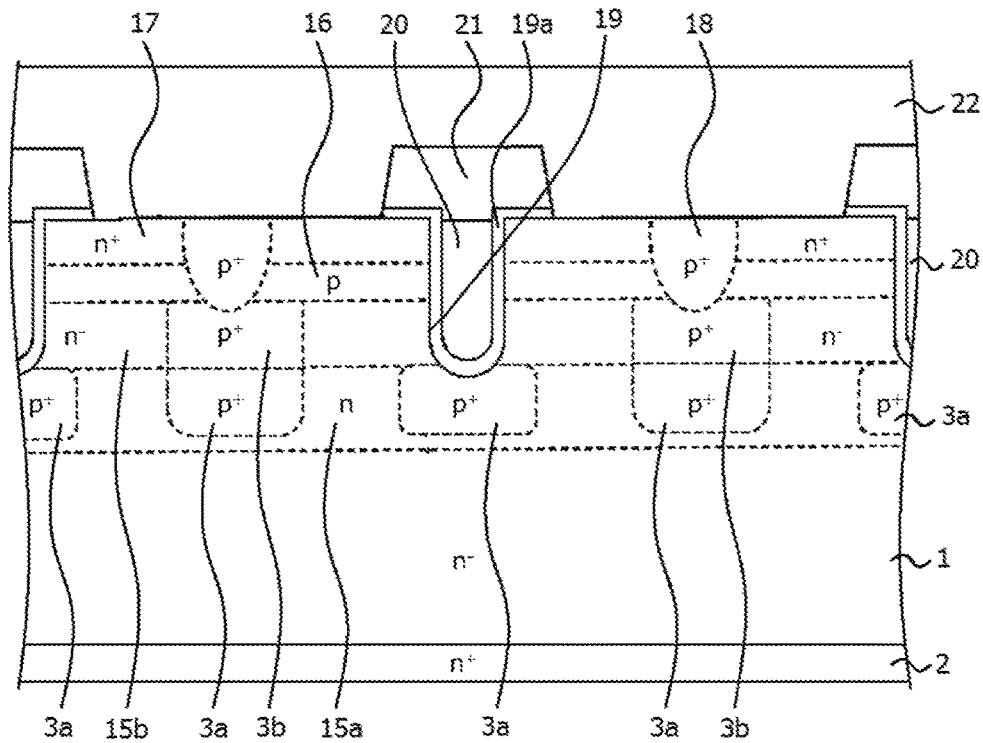

Next, as depicted in FIG. 7, the trenches 19 are formed from the front surface of the silicon carbide semiconductor substrate by patterning by photolithography and dry etching so as to not penetrate the p+-type region 3a. The trenches 19 may preferably have a width of about 0.1 to 1.5 μm and a depth of about 0.2 to 2.0 μm. The trenches 19 may be formed to penetrate into, but not through, the p+-type region 3a in the n-type layer 15a. An interlayer insulating film 19a is deposited so as to cover the inside of the trenches 19. The interlayer insulating film 21, for example, is formed by a high-temperature oxide (HTO) film formed at a high temperature of about 600 to 900 degrees C. by a low-pressure CVD method to have a thickness of 30 nm to 200 nm.

After poly-silicon is deposited so as to be embedded in the trenches 19, etching is performed leaving the poly-silicon in at least ⅔ of the depth of the trenches 19 thereby forming the gate electrodes 20. On the gate electrode 20, after an oxide film having a thickness of about 0.1 to 3.0 μm is deposited, patterning and etching are performed, forming the interlayer insulating film (field insulating film) 21. In one embodiment, the interlayer insulating film 21 and the interlayer insulating film 19a are formed of the same material.

Thereafter, on the front surface of the silicon carbide semiconductor substrate, one or more of titanium, nickel, tungsten, and aluminum are deposited by a deposition method or a sputtering method to have a total thickness of about 0.5 to 8.0 μm and patterning and etching are performed, forming the source electrode 22.

As described, the structure of the active region depicted in the embodiment may be formed. Further, by the semiconductor production method above, the active region (FIG. 1) of the trench-type MOSFET of the embodiment may be formed.

In FIG. 7 (and FIG. 1), although a structure of only three trenches is depicted, more trench MOS structures may be arranged in parallel, and embodiments of the invention encompass any number of trench MOS structures arranged in parallel.

To retain the breakdown voltage in the OFF state, there are configurations in which an edge termination structure region is provided at an element outer periphery region of the active region as an edge termination structure. A typical example is a method of forming a junction termination extension (JTE) at a mesa portion.

Figure 8:
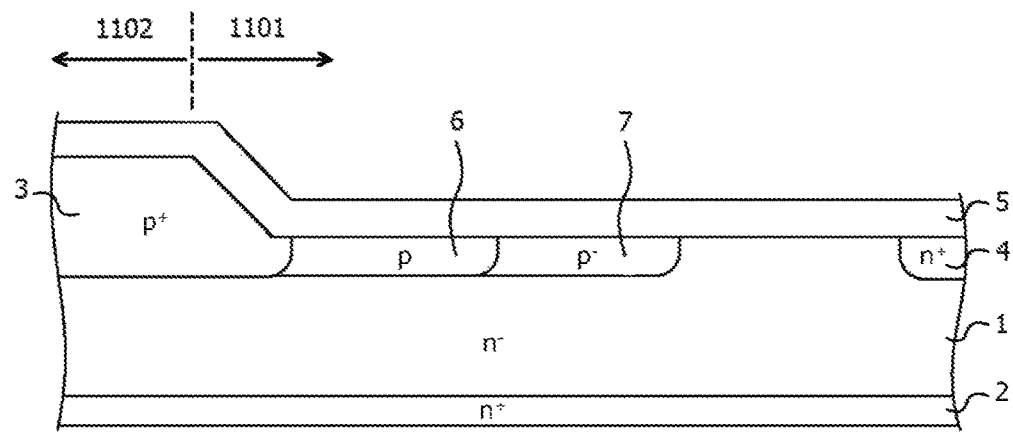
FIGS. 8 and 9 are cross-sectional views of an example of an edge termination structure region of the semiconductor device.
Figure 9:
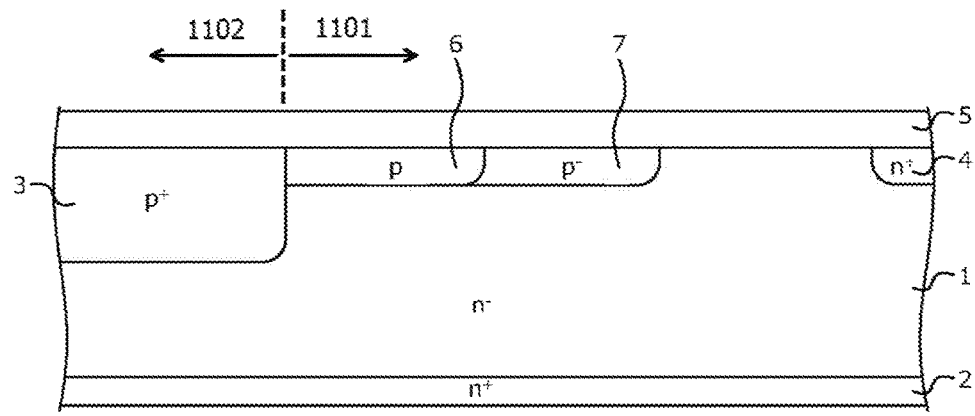
Figure 10:
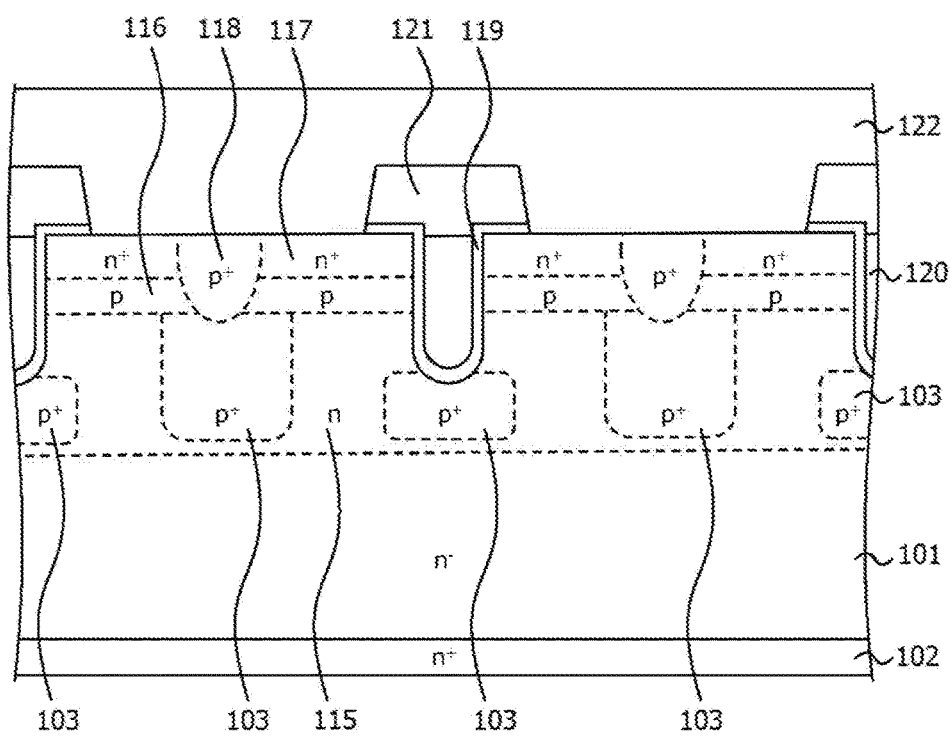
FIG. 10 is a cross-sectional view of an active region of a conventional trench-type MOSFET.

FIGS. 8 and 9 are cross-sectional views of an example of an edge termination structure region of the semiconductor device. An edge termination structure region 1101 depicted in FIG. 8 is formed on the silicon carbide semiconductor substrate 2, outside the active region 1102 described above. The edge termination structure region 1101 has the p$^+$-type base layer 3, an n$^+$-type channel stopper region 4, an interlayer insulating film 5, a first JTE region (p-type layer) 6, and a second JTE region (p$^-$-type layer) 7 formed on the front side of the n$^-$-type silicon carbide epitaxial layer 1 formed on the n$^+$-type silicon carbide substrate 2.

In the case of the edge termination structure region 1101 depicted in FIG. 8, when patterning is performed in a region having a height different from the active region 1102, like a mesa portion, the depth of focus of the photolithography differs and process difficulty is improved. In contrast, as depicted in FIG. 9, there is a further structure in which the edge termination structure region 1101 and the active region 1102 have the same height and no mesa portion is formed. In this manner, the structure of the edge termination structure region 1101 may be implemented by various types of structures.

According to the structure of the active region described, the n-type layer is double-layered and is provided having an impurity concentration that is lower in the n$^-$-type layer 15b near the channel p-type layer 16 than in the n-type layer 15a. According to this structure, the overall impurity concentration of the n-type layer 15 (15a, 15b) is reduced and in the ON state, a threshold value decrease originating in the short channel effect of DIBL may be suppressed.

Here, when the impurity concentration of the n-type layer 15 having a single-layer structure is simply reduced, the depletion layer spreads easily from the p-type layer, the current path is blocked, and the ON resistance suddenly increases. However, in the embodiment, the two-layer structure is provided in which the impurity concentration of the n$^-$-type layer 15b near the channel p-type layer 16 is lower with respect to the n-type layer 15a enables DIBL to be suppressed.

Concerning this point, in a conventional trench-type MOSFET, when the channel length is reduced to reduce the ON resistance, short channel effects such as decreased threshold occur. However, by setting the impurity concentration ratio of the n$^-$-type layer 15b and the n-type layer 15a to be 1.0 to 0.5, short channel effects and increases of parasitic resistance may be suppressed.

As described, according to the embodiment of the present invention, increases of parasitic resistance and the occurrence of short channel effects may be suppressed, and the channel length may be further reduced, enabling reduction of the ON resistance.

However, with a conventional trench-type MOSFET, since short channel effects such as decreased threshold occur when the channel length is reduced to reduce the ON resistance, a new problem of suppressing short channel effects arises. For example, short channel effects occur in regions in which the channel length is less than 1.0 μm.

According to the embodiment, the semiconductor layer of the first conductivity type near the channel region of the second conductivity type and effective in suppressing DIBL is provided as two layers in which the second semiconductor layer, which is the upper layer and of the first conductivity type, has an impurity concentration that is reduced more than the impurity concentration of the third semiconductor layer, which is the lower layer and of the first conductivity type. The impurity concentration ratio of these semiconductor layers of the first conductivity type are set to be, for example, 1.0 to 0.5 whereby short channel effects and increases in parasitic resistance may be suppressed.

The semiconductor device according to the present invention achieves an effect in that increases of parasitic resistance and the occurrence of short channel effects may be suppressed, and the ON resistance may be reduced by further reducing the channel length.

As described, the semiconductor device according to the present invention is useful for high voltage semiconductor devices used in power converting equipment and power supply devices such as those in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device having an active region through which current flows, the semiconductor device comprising in the active region:
   a semiconductor substrate of a first conductivity type;
   a first first-conductivity-type semiconductor layer formed on a front surface of the semiconductor substrate, the first first-conductivity-type semiconductor layer having a concentration lower than that of the semiconductor substrate;
   a second first-conductivity-type semiconductor layer located above the first first-conductivity-type semiconductor layer;
   a third first-conductivity-type semiconductor layer located between the first first-conductivity-type semiconductor layer and the second first-conductivity-type semiconductor layer, the third first-conductivity-type semiconductor layer having an impurity concentration higher than that of second first-conductivity-type semiconductor layer and that of first first-conductivity-type semiconductor layer, and the third first-conductivity-type semiconductor layer being in contact with the second first-conductivity-type semiconductor layer and the first first-conductivity-type semiconductor layer;
   a channel region of a second conductivity type located above the second first-conductivity-type semiconductor layer, contacting a surface of the second firstconductivity-type semiconductor layer opposite the third first-conductivity-type semiconductor layer;

a plurality of trenches extending through channel region and the second first-conductivity-type semiconductor layer, the trenches having an oxide film and a gate electrode embedded therein;

a plurality of first second-conductivity-type semiconductor regions, including at least one first second-conductivity-type semiconductor region arranged beneath one of the plurality of trenches, and at least another of the first second-conductivity-type semiconductor regions arranged between adjacent trenches of the plurality of trenches, the plurality of first second-conductivity-type semiconductor regions formed in the third first-conductivity-type semiconductor layer; and a second second-conductivity-type semiconductor region formed in the second first-conductivity-type semiconductor layer and contacting the at least another first second-conductivity-type semiconductor region located between the adjacent trenches of the plurality of trenches, wherein the second first-conductivity-type semiconductor layer is in contact with the channel region, the second second-conductivity-type semiconductor layer, and the plurality of trenches.

2. The semiconductor device according to claim 1, wherein
the second first-conductivity-type semiconductor layer has an impurity concentration that is less than 1.0 times, and equal to or greater than 0.5 times, that of the third first-conductivity-type semiconductor layer.

3. The semiconductor device according to claim 1, wherein the plurality of first second-conductivity-type semiconductor regions and the second second-conductivity-type semiconductor region have a same impurity concentration.

4. A method of manufacturing a semiconductor device having an active region through which current flows, the method comprising:

forming a first first-conductivity-type semiconductor layer in the active region on a front surface of a semiconductor substrate of a first conductivity type, the first first-conductivity-type semiconductor layer having a concentration lower than that of the semiconductor substrate;

forming a third first-conductivity-type semiconductor layer on a front surface of the first first-conductivity-type semiconductor layer, the third first-conductivity-type semiconductor layer having an impurity concentration higher than that of the first first-conductivity-type semiconductor layer;

forming a plurality of first second-conductivity-type semiconductor layers in the third first-conductivity-type semiconductor layer;

forming a second first-conductivity-type semiconductor layer on a front surface of the third first-conductivity-type semiconductor layer, the second first-conductivity-type semiconductor layer having an impurity concentration lower than that of the third first-conductivity-type semiconductor layer;

forming a second second-conductivity-type semiconductor layer in the second first-conductivity-type semiconductor layer so as to contact a first second-conductivity-type semiconductor layer of the plurality of first second-conductivity-type semiconductor layers;

forming a channel region of a second conductivity type on a front surface of the second first-conductivity-type semiconductor layer; and forming a trench so as to be in contact with the channel region and have a depth reaching at least one of the plurality of first second-conductivity-type semiconductor layers, the trench having an oxide film and gate electrode embedded therein.

* * * * *